(12) United States Patent
Murayama et al.

(10) Patent No.: US 7,960,698 B2
(45) Date of Patent: Jun. 14, 2011

(54) REFLECTIVE COLLECTION-TYPE LIGHT RECEIVING UNIT AND LIGHT RECEIVING APPARATUS FOR SPATIAL LIGHT COMMUNICATIONS

(75) Inventors: Fumitaka Murayama, Nagoya (JP); Hiroyuki Kurokawa, Tokyo (JP)

(73) Assignee: Planners Land Co., Ltd., Aichi (JP)

( * ) Notice: Subject to any disclaimer, the term of this patent is extended or adjusted under 35 U.S.C. 154(b) by 268 days.

(21) Appl. No.: 12/434,783

(22) Filed: May 4, 2009

(65) Prior Publication Data
US 2009/0283679 A1    Nov. 19, 2009

(30) Foreign Application Priority Data
May 13, 2008    (JP) ................................. 2008-126407

(51) Int. Cl.
*G01J 5/00*    (2006.01)
(52) U.S. Cl. .................... 250/336.1; 250/338.1; 250/216
(58) Field of Classification Search ............... 250/336.1, 250/338.1, 216
See application file for complete search history.

(56) References Cited

U.S. PATENT DOCUMENTS

| | | | |
|---|---|---|---|
| 5,412,202 A | 5/1995 | Sato | |
| 5,986,787 A | 11/1999 | Ohshima et al. | |
| 6,516,115 B1 | 2/2003 | Fujita et al. | |
| 2005/0161605 A1* | 7/2005 | Yokura et al. | 250/343 |
| 2006/0062099 A1 | 3/2006 | Yazaki et al. | |
| 2008/0085552 A1* | 4/2008 | Larson et al. | 435/288.7 |

FOREIGN PATENT DOCUMENTS

| | | |
|---|---|---|
| GB | 2122044 A | 1/1984 |
| JP | 10-322276 A | 12/1998 |
| JP | 2007-266794 A | 10/2007 |

OTHER PUBLICATIONS

European Search Report dated Sep. 17, 2009, issued European Patent Application No. 09006289.

* cited by examiner

*Primary Examiner* — David P Porta
*Assistant Examiner* — Djura Malevic
(74) *Attorney, Agent, or Firm* — Westerman, Hattori, Daniels & Adrian, LLP

(57) ABSTRACT

The reflective collection-type light receiving unit of the present invention is a reflective collection-type light receiving unit having a light receiving element which receives spatial light on which an information signal is superimposed after being reflected and collected via a concave mirror. The light receiving element is arranged approximately at the center inside the concave mirror, with the light receiving plane thereof facing to the reflection plane of the concave mirror. A pair of electrode leads connected to both electrodes of the light receiving element are extended so as to be opened from the center on the front plane of the concave mirror to both sides and connected to a light receiving circuit by way of the lateral plane of the concave mirror.

10 Claims, 5 Drawing Sheets

REFLECTIVE COLLECTION-TYPE LIGHT RECEIVING UNIT AND LIGHT RECEIVING APPARATUS FOR SPATIAL LIGHT COMMUNICATIONS

BACKGROUND OF THE INVENTION

1. Field of the Invention

The present invention relates to a reflective collection-type light receiving unit and a light receiving apparatus for spatial light communications using the reflective collection-type light receiving unit and more particularly to a reflective collection-type light receiving unit for spatial light communications for performing communications using visible light or infrared light radiated in a space and a light receiving apparatus for spatial light communications in which a plurality of reflective collection-type light receiving units are arranged in an array to realize communications higher in sensitivity and responsiveness.

2. Description of Related Art

Wireless communications by using radio waves as a communication medium have found many uses in various fields such as cellular phone networks, wireless LANs and short-distance wireless communications.

However, in wireless communications in which radio waves are used as a medium, it is impossible to increase the transmission power, with the influence of electromagnetic waves on the human body taken into account, where the transmitting and receiving are performed near people. Further, since the frequency range of radio waves used in wireless communications has already been allocated in many areas and actually used, it is impossible to use freely frequencies over a wide range. Still further, under special circumstances such as medical institutions, there are some restrictions, for example, the limited use of radio waves.

Thus, in recent years, there has been developed visible light communications in which visible light is used as a communication medium, and a visible light communication system has been proposed in Japanese Published Patent Application No. 2007-266794 A.

In this type of a conventional visible light communication system, ordinarily, a light receiving element equipped with an optical system including a collecting lens is used as a light receiving unit on the side of a receiver, and light projected from a projector on the side of a transmitter is collected by the optical system and focused on the light receiving element, thereby outputting a light receiving signal. In particular, in visible light communications movable in a relative position between the transmitter and the receiver, in order to increase a light collecting percentage of light, with consideration given to a case where light radiated from the projector of the transmitter is lower in the amount of light arriving at a light receiving unit of the receiver, the optical system including the collecting lens is required to be larger in size, the light receiving unit is made relatively larger in configuration, and in particular the use of the collecting lens increases the thickness dimension of the light receiving unit, thus posing a problem that it is difficult to downsize the optical system.

On the other hand, Japanese Published Patent Application No. H10-322276 A has disclosed a light receiving unit for spatial light communications in which a reflector lens is arranged on a light receiving path of a light receiving element to decrease the thickness dimension of the light receiving unit. However, in this reflective collection-type light receiving unit, a convex mirror and a concave mirror are arranged inside the reflector lens to constitute an optical system and a light receiving element is arranged behind the reflector lens, thereby posing another problem that the optical system is increased in size.

Further, the light receiving unit of this type of a conventional spatial light communication apparatus is constituted in such a manner that a plurality of reflective collection-type light receiving units are arranged in an array and a light receiving element of each of the reflective collection-type light receiving units is ordinarily mounted on a substrate of a light receiving circuit. In particular, where the plurality of light receiving elements are connected in parallel to the input side of an amplifying part of the light receiving circuit, a floating electrostatic capacitance generated between a pair of electrode leads of each light receiving element and the ground is multiplied only by the number of light receiving elements to be used and increased accordingly. There has been posed such a problem that an electrostatic capacitance generated on the electrode leads of the anode and the cathode of the light receiving element is increased to reduce a response speed of the light receiving element, thereby inhibiting spatial light communications at high speed.

SUMMARY OF THE INVENTION

An object of the present invention is to provide a reflective collection-type light receiving unit higher in light receiving efficiency and capable of being downsized and also to provide a light receiving apparatus for spatial light communications higher in sensitivity and responsiveness in which the above-described reflective collection-type light receiving unit is used.

An object of the present invention can be accomplished by a reflective collection-type light receiving unit and a light receiving apparatus for spatial light communications which are constituted as below.

More specifically, the reflective collection-type light receiving unit of the present invention is a reflective collection-type light receiving unit having a light receiving element for reflecting and collecting spatial light on which an information signal is superimposed via a concave mirror, in which the light receiving element is arranged approximately at the center inside the concave mirror, with the light receiving plane of the light receiving element facing to the reflecting plane of the concave mirror, and a pair of electrode leads connected to both electrodes of the light receiving element are extended so as to be opened from the center on the front plane of the concave mirror to both sides and connected to a light receiving circuit by way of the lateral plane of the concave mirror.

According to the present invention, since a light receiving element is arranged inside a concave mirror, the concave mirror, that is, a main body of the light receiving unit can be decreased in the thickness dimension to greatly downsize a reflective collection-type light receiving unit. Further, a pair of electrode leads connected to both electrodes of the light receiving element are extended so as to be opened from the center on the front plane of the concave mirror to both sides and connected to an amplifier circuit and others of a light receiving circuit by way of the lateral plane of the concave mirror. It is, therefore, possible to greatly reduce an electrostatic capacitance generated between the pair of electrode leads and the ground on a light receiving circuit as compared with a case where a light receiving element is simply connected to the input side of a preamplifier or the like. Thereby, it is possible to prevent a reduction in response speed of the light receiving element resulting from the electrostatic capacitance and realize high-speed spatial light communications higher in responsiveness.

In this instance, the back plane of the concave mirror is fixed firmly on a circuit substrate and also the pair of electrode leads of the light receiving element are connected to a conductive layer on the circuit substrate, by which the light receiving unit can be mounted on the circuit substrate.

According to the present invention, it is possible to downsize the light receiving unit by decreasing the thickness of the reflective collection-type light receiving unit including the circuit substrate. It is also possible to further reduce an electrostatic capacitance generated between the pair of electrode leads and the ground of the circuit substrate as compared with a case where the light receiving element is simply connected to the input side of the light receiving circuit on the circuit substrate, thereby improving high-speed responsiveness of the light receiving element.

Further, the concave mirror contains a transparent synthetic resin inside a recessed part thereof and the concave mirror can be set to focus on a position which is deviated forward from the center on the front plane of the concave mirror.

According to the present invention, the recessed part of the concave mirror, that is, the inside of the reflecting plane is filled with a transparent synthetic resin, by which the reflecting plane and the light receiving plane of the light receiving element can be protected and also the concave mirror can be easily set to focus on any predetermined position by arbitrarily adjusting a refractive index of light. Further, the concave mirror is set to focus on a position which is deviated forward from the center on the front plane of the concave mirror, thus making it possible to prevent breakage of the light receiving element or burning of the transparent synthetic resin when sunlight is made incident into the concave mirror of the light receiving unit.

Still further, it is preferable that a blue light photodiode which receives blue light at the highest sensitivity is used as the above-described light receiving element. The blue light photodiode is higher in sensitivity and responsiveness as compared with a photodiode for yellow light or white light, and a projector of the transmitter is able to use a white light emitting diode in which blue light of a blue light emitting diode operating at high speed can be focused on a yellow fluorescent body to project white light. Therefore, where spatial light (white light containing blue light) on which a high-speed information signal is superimposed is illuminated and projected from the transmitter, the light receiving element of the light receiving unit receives the high-speed information signal, thereby performing communications at high speed.

On the other hand, the light receiving apparatus for spatial light communications in the present invention is a light receiving apparatus for spatial light communications using a reflective collection-type light receiving unit in which spatial light on which an information signal is superimposed is reflected and collected via the concave mirror and received by the light receiving element, and the light receiving apparatus in which a plurality of reflective collection-type light receiving units are arranged in an array, each of the reflective collection-type light receiving units is arranged at the center on the front plane of the concave mirror, with the light receiving plane of the light receiving element facing to the reflecting plane of the concave mirror, a pair of electrode leads connected to both electrodes of the light receiving element are extended so as to be opened from the center on the front plane of the concave mirror to both sides, the end of the electrode lead of each of the reflective collection-type light receiving units is connected to a light receiving circuit by way of the lateral plane of the concave mirror, and a plurality of light receiving elements are connected in parallel to the input side of the light receiving circuit.

According to the present invention, since the plurality of light receiving elements are connected in parallel on the input side of a preamplifier of the light receiving circuit to take in an input signal from each of the light receiving elements, it is possible to increase the light receiving sensitivity (signal receiving sensitivity) depending on the number of light receiving elements. Further, an electrostatic capacitance generated on the light receiving element of each of the reflective collection-type light receiving units is very small as compared with a light receiving element of a conventional light receiving unit. As a result, it is possible to improve the high-speed responsiveness of the light receiving element and also perform spatial light communications at high speed.

In this instance, it is preferable that the above-described plurality of reflective collection-type light receiving units are mounted on one sheet of a circuit substrate and arranged in an array so that the back plane of the concave mirror thereof is firmly fixed on one sheet of the circuit substrate and also a pair of electrode leads of the light receiving element are connected to a conductive layer on the circuit substrate.

According to the present invention, the plurality of reflective collection-type light receiving units mounted on one sheet of the circuit substrate can be further decreased in thickness to downsize the light receiving apparatus. It is also possible to further reduce an electrostatic capacitance generated between a pair of electrode leads and the ground of the circuit substrate as compared with a case where a light receiving element is simply connected to the input side of a preamplifier or the like on a circuit substrate and also improve the high-speed responsiveness of the light receiving element.

As described so far, the reflective collection-type light receiving unit of the present invention is able to receive spatial light which contains visible light or infrared light at a high light receiving efficiency and can be downsized in configuration. It is also possible to prevent a reduction in response speed of the light receiving element resulting from an electrostatic capacitance and provide a light receiving unit for spatial light communications higher in sensitivity and responsiveness. Further, the light receiving apparatus for spatial light communications in the present invention is able to increase the light receiving sensitivity (signal receiving sensitivity) depending on the number of light receiving elements, and is also able to reduce an electrostatic capacitance generated on the light receiving element of each of the reflective collection-type light receiving units, thereby improving high-speed responsiveness of the light receiving element to perform spatial light communications at high speed.

DESCRIPTION OF THE PREFERRED EMBODIMENTS

Hereinafter, a description will be given to an embodiment of the present invention with reference to the drawings. In addition, the present invention shall not be limited to the embodiment. Any modification within requirements of the claims or equivalents of the requirements shall be included within the scope of the claims.

Figure 1:
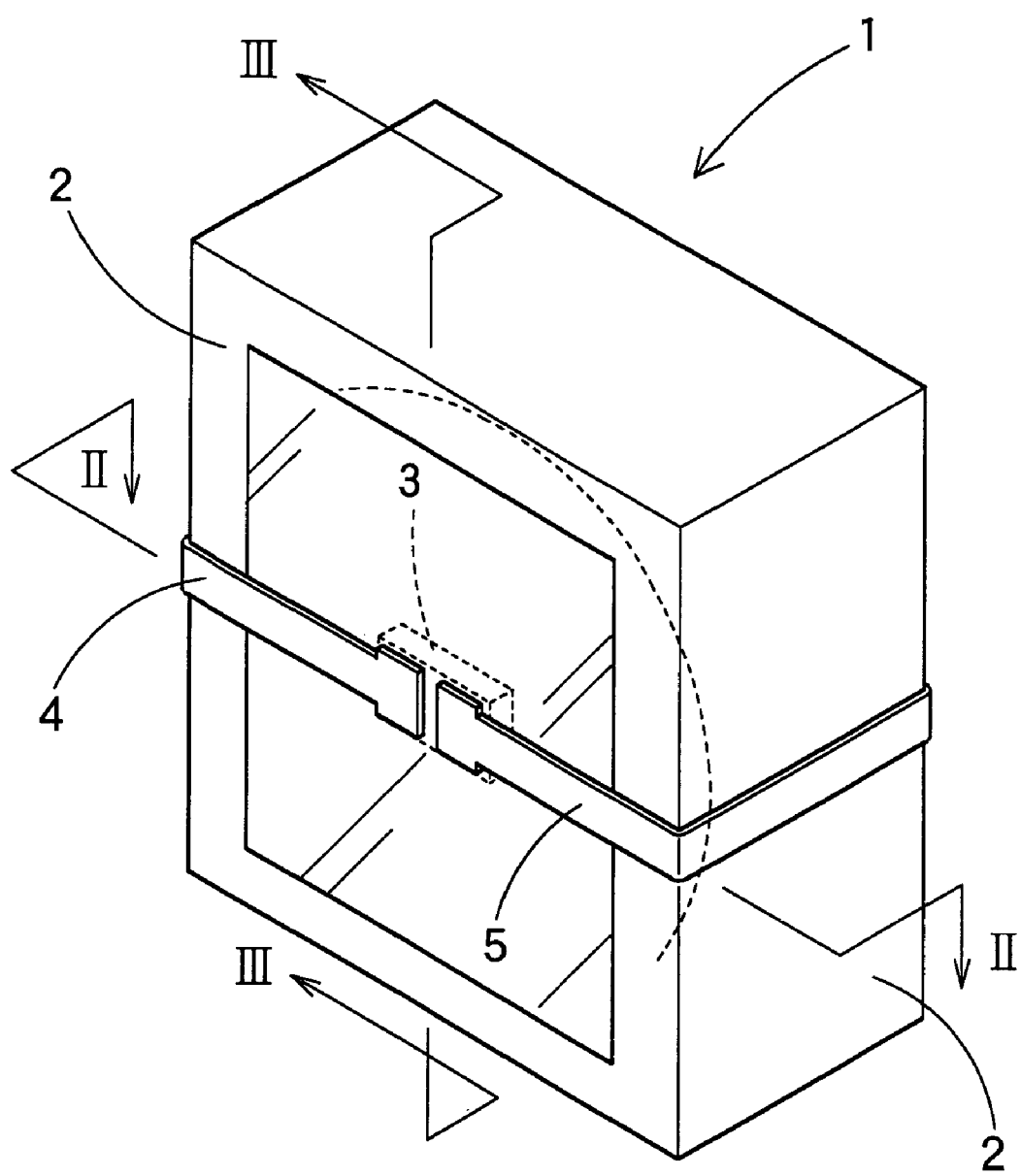
FIG. 1 is an enlarged perspective view of a reflective collection-type light receiving unit of an embodiment in the present invention.
Figure 2:
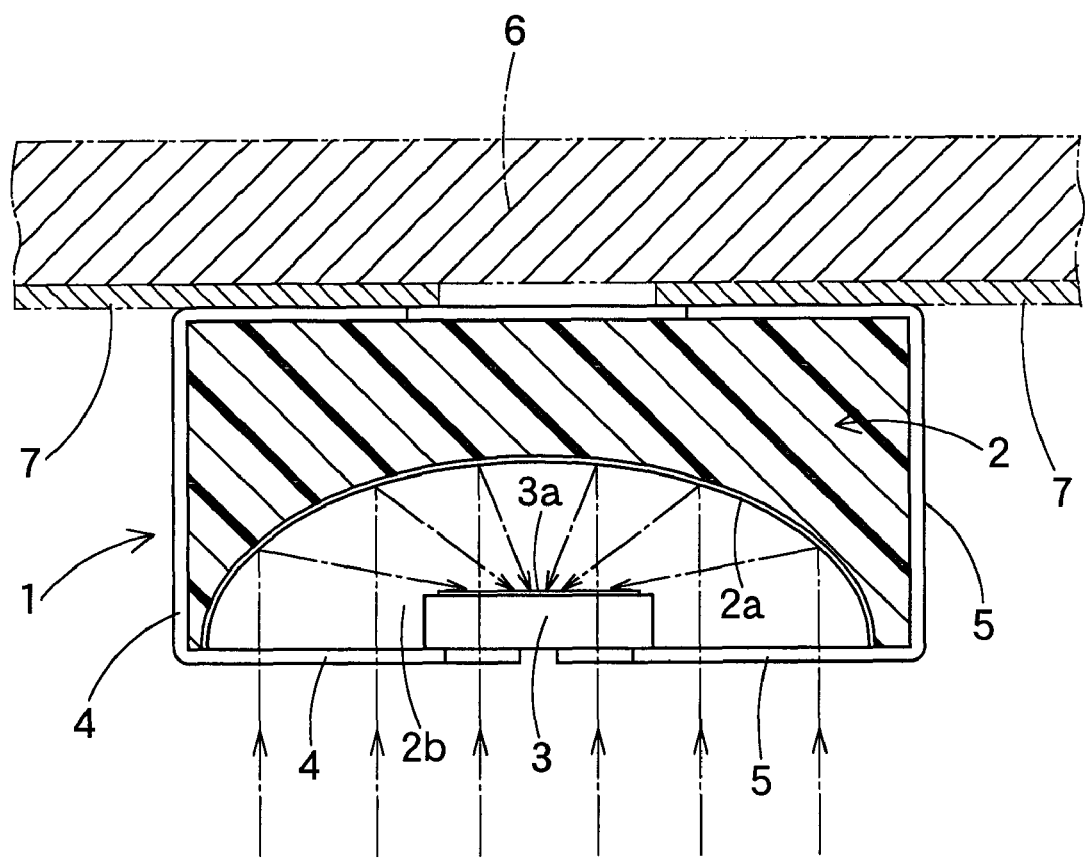
FIG. 2 is a cross sectional view taken along the line of II-II given in FIG. 1.

FIG. 1 is an enlarged perspective view of a reflective collection-type light receiving unit 1 for spatial light communications, and FIG. 2 is an enlarged cross sectional view thereof. In brief, the reflective collection-type light receiving unit 1 is a light receiving unit which reflects and collects via a concave mirror 2 spatial light projected and illuminated from a transmitter (not illustrated) to receive the light by a light receiving element 3, in which a light receiving element 3 is arranged approximately at the center inside the concave mirror 2, with a light receiving plane 3a thereof facing to a reflecting plane 2a of the concave mirror 2. A pair of electrode leads 4, 5 connected to both electrodes of the light receiving element 3 are extended in such a manner as to be opened from the center on the front plane of the concave mirror 2 to both sides and connected to a light receiving circuit 8 on a circuit substrate 6 by way of the lateral plane of the concave mirror 2.

Figure 3:
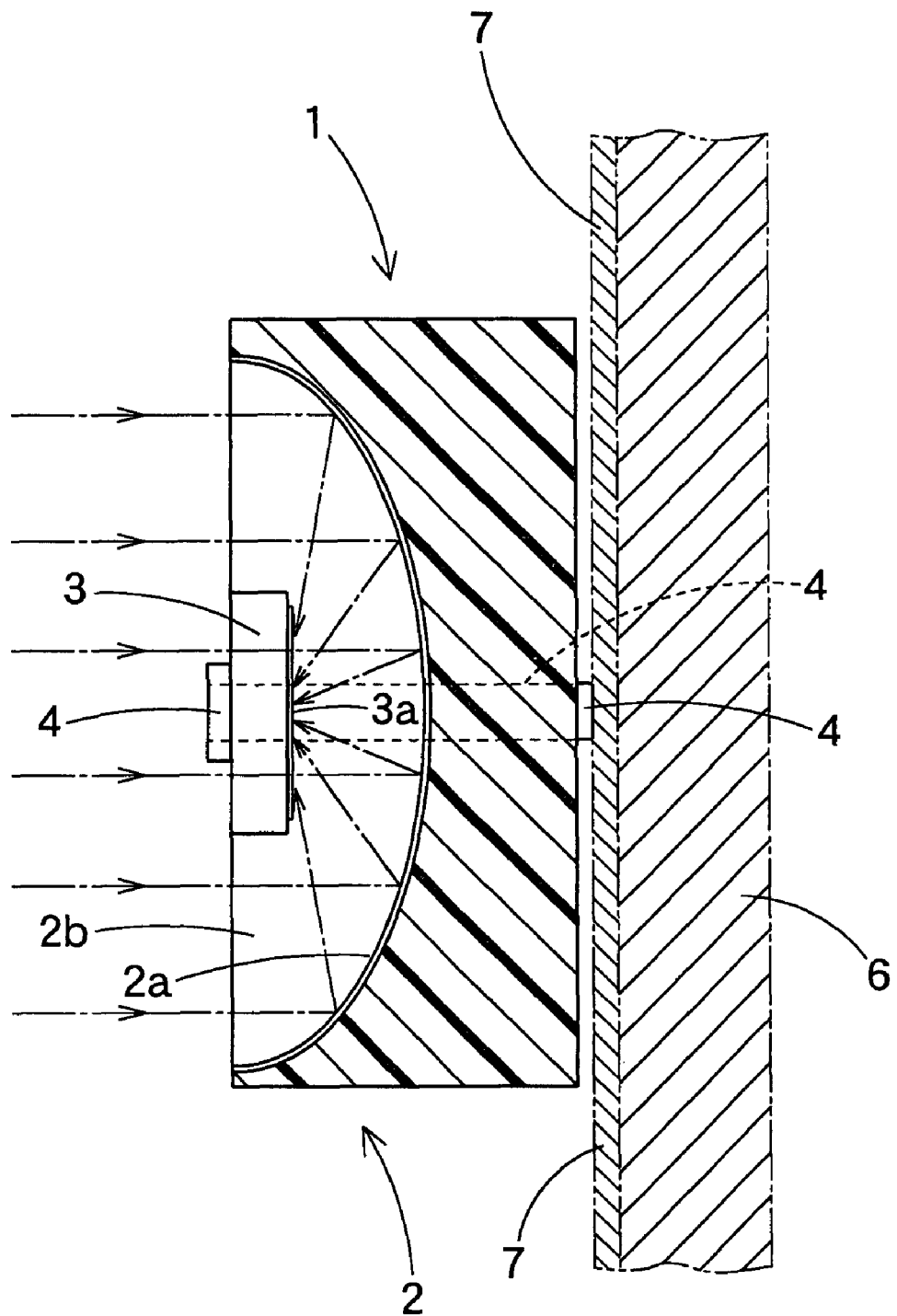
FIG. 3 is a cross sectional view taken along the line of III-III given in FIG. 1.

As shown in FIG. 1 to FIG. 3, a main body of the concave mirror 2 is formed approximately in a rectangular solid shape by using a synthetic resin, and a recessed part 2b having a paraboloid or a ellipsoid is formed on the front plane of the main body. More specifically, the front plane (inner plane) of the recessed part 2b is formed as a paraboloid or an ellipsoid, and a metal film for reflection is formed on the paraboloid or the ellipsoid by plating or vapor deposition, thereby giving a reflecting plane 2a. The metal film is made with metals such as silver and aluminum. As described above, the concave mirror 2 is formed as a paraboloid mirror or an ellipsoid mirror.

The concave mirror 2 is formed by using a synthetic resin and metal plating or a metal vapor deposition film in a very small size so as to give a front plane of about 8 mm high, 8 mm wide and 3 mm thick as dimensions. The reflective collection-type light receiving unit 1 can be decreased in the thickness dimension of the concave mirror 2 (reflective collection-type light receiving unit 1) because the light receiving element 3 is arranged inside the recessed part 2b of the concave mirror 2. More specifically, the light receiving element 3 is formed very small in size so as to give, for example, dimensions of approximately 2.8 mm long, 1.4 mm wide and 1.1 mm high, and arranged inside the front center of the concave mirror 2. The small-size concave mirror 2 is combined with the small-size light receiving element 3 to downsize the reflective collection-type light receiving unit 1 to a greater extent.

The main body of the concave mirror 2 is formed in a rectangular solid shape by using a synthetic resin, for example, a thermoplastic resin (such as PEEK resin and PPS resin). The light receiving element 3 is arranged inside the concave mirror 2, that is, approximately at the center inside the recessed part 2b, with the light receiving plane 3a thereof facing to the reflecting plane 2a of the concave mirror 2.

Electrode leads 4, 5 are respectively connected to a pair of electrodes (anode electrode, cathode electrode) of the light receiving element 3 by soldering or by using a conductive adhesive agent, and the pair of electrode leads 4, 5 connected to both the electrodes are arranged so as to be opened from the center on the front plane of the concave mirror 2 to both sides. The both electrode leads 4, 5 are bent at a right angle from the front plane of the concave mirror 2 along the lateral plane thereof, and the ends of the electrode leads 4, 5 are also bent at a right angle from the lateral plane of the concave mirror 2 to the back plane thereof and fixed on a circuit substrate 6. The light receiving element 3 is held by both of these electrode leads 4, 5 at the center spatial position on the front plane of the recessed part 2b of the concave mirror 2, and both of the electrode leads 4, 5 are to be fixed on the concave mirror 2 by holding the outside of the main body of the concave mirror 2 between both sides.

Further, a groove is formed along the front plane, lateral plane and back plane of the main body of the concave mirror 2 with which both of the electrode leads 4, 5 are in contact, and the light receiving element 3 and the electrode leads 4, 5 are fitted into a predetermined position of the concave mirror 2 so that the electrode leads 4, 5 are fitted into the groove and also bonded together with an adhesive agent. Thereby, the electrode leads 4, 5 can be used to fix accurately and firmly the light receiving element 3 in the vicinity on which the concave mirror 2 focuses.

As described so far, when the reflective collection-type light receiving unit 1 is mounted on the circuit substrate 6, the ends of the electrode leads 4, 5 are in contact with a conductive layer 7 on the circuit substrate 6 (on the input side of a light receiving circuit), thereby bonded and connected by reflow soldering or the like. The pair of electrode leads 4, 5 are extended so as to be opened from the center on the front plane of the concave mirror 2 to both sides and connected to a light receiving circuit 8 by way of the lateral plane of the concave mirror 2. Therefore, an electrostatic capacitance generated between the pair of electrode leads 4, 5 and the ground of a preamplifier 9 on the light receiving circuit 8 can be reduced greatly as compared with a case where the light receiving element is simply connected to the input side of the preamplifier or the like.

Although a space is given inside the recessed part 2b of the concave mirror 2, it is preferable that in a state that the light receiving element 3 is installed at the center on the front plane of the concave mirror 2, a transparent synthetic resin (for example, epoxy resin) is filled inside the recessed part 2b, thereby covering the reflecting plane 2a of the concave mirror 2 and the light receiving plane 3a on the reflection plane of the light receiving element 3 with the transparent synthetic resin.

The reflecting plane 2a and the light receiving plane 3a of the light receiving element 3 are covered with a transparent synthetic resin, thus making it possible to protect the reflecting plane 2a and the light receiving plane 3a of the light receiving element 3. Further, the transparent synthetic resin is filled into the recessed part 2b to adjust a refractive index of light inside the concave mirror 2, thereby adjusting arbitrarily the concave mirror 2 so as to focus on any predetermined position. The concave mirror 2 is set to focus on a position which is deviated forward from the light receiving element 3, by which when sunlight is made incident into the concave mirror 2, the sunlight will not focus on the light receiving element 3, thus preventing breakage of the light receiving element 3 resulting from solar heat.

A blue light photodiode structured by forming a zinc oxide crystalline thin film on a silicon substrate to effect heterojunction of zinc oxide with silicon is used as the light receiving element 3. The blue light photodiode is a photodiode which receives blue spatial light at the highest sensitivity to effect photoelectric conversion highly efficiently and also outputs a light receiving signal at high responsiveness. It is noted that blue light includes blue laser light in addition to ordinary blue light, and the light receiving element 3 may also include a photodiode for blue laser light which is used in monitoring laser light of a DVD and R/RW/-RAM, for example. Further, the blue light includes not only pure blue light but also bluish-purple light. A blue light photodiode in which the element has a peak light-receiving sensitivity of 405 nm (bluish-purple light wavelength) or a peak light-receiving sensitivity of 460 nm (blue light wavelength) may be used.

The above-described blue light photodiode is formed, for example, by providing a light receiving plane 3a with a diameter of approximately 0.6 mm on a package of 2.8 mm long, 1.4 mm wide and 1.1 mm high. Although, in general, a light receiving plane on an ordinary white light photodiode is approximately 0.2 mm in diameter, the light receiving plane of the blue light photodiode is approximately three times greater. Therefore, the blue light photodiode is provided with a light receiving part which is much greater in diameter than that of an ordinary white light photodiode. The blue light photodiode is higher in light receiving sensitivity of 0.28 A/W (at the time of 405 nm wavelength) due to the fact that the light receiving part thereof is greater in diameter. Further, the blue light photodiode is provided with the light receiving part greater in diameter and also very high in responsiveness, for example, approximately 400 MHz when a reverse bias voltage is 2V.

As an advantage to using the blue light photodiode which has the light receiving plane 3a, the diameter of which is approximately 0.6 mm much greater than the light receiving plane of an ordinary white light photodiode, there is no need for focusing subtle light collected from the concave mirror 2 on the light receiving plane 3a of the light receiving element 3, thus making it possible to receive at high sensitivity light which is deviated to some extent from a focus position. High energy light such as sunlight is not focused on the light receiving element 3, thereby avoiding thermal damage of the light receiving element 3. Further, the depth of field is made deeper, by which scattered spatial light reflected on the wall or the like is efficiently received so as not to be substantially affected by deviation of a distance or a position from the projector of the transmitter.

Figure 4:
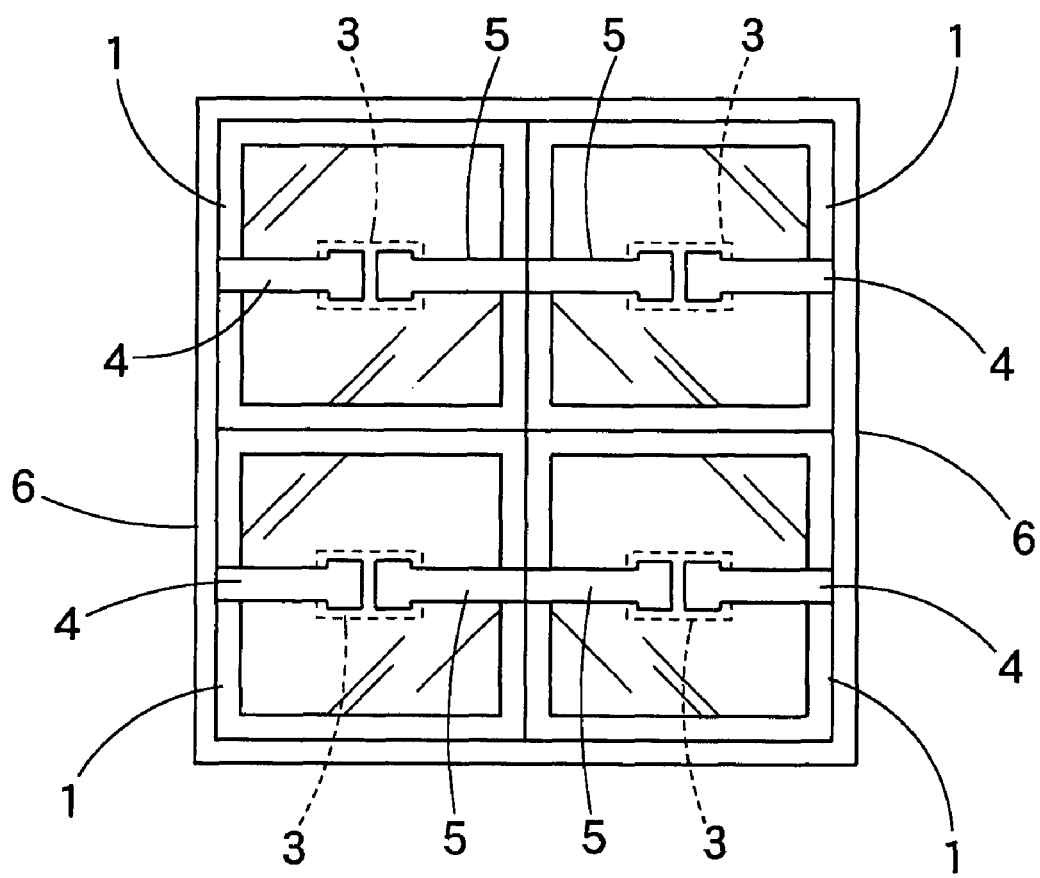
FIG. 4 is a front view showing a state that a plurality of reflective collection-type light receiving units are mounted on a circuit substrate.

FIG. 4 is a front view showing a light receiving apparatus for spatial light communications using the above-constituted reflective collection-type light receiving unit 1. Here, four reflective collection-type light receiving units 1 are arranged, with the back plane of the concave mirror 2 thereof firmly fixed on one sheet of a rectangular circuit substrate 6. As shown in FIG. 2 and FIG. 3, a pair of electrode leads 4, 5 of each light receiving element 3 are bonded to a conductive layer 7 on the circuit substrate 6 and connected in parallel to each other, by which the four reflective collection-type light receiving units 1 are mounted in an array on one sheet of the rectangular circuit substrate 6. Since each of the reflective collection-type light receiving units 1 is provided with a main body formed in a rectangular solid shape, these light receiving units are arranged in an array, with no clearance left between each other, and can be downsized.

Figure 5:
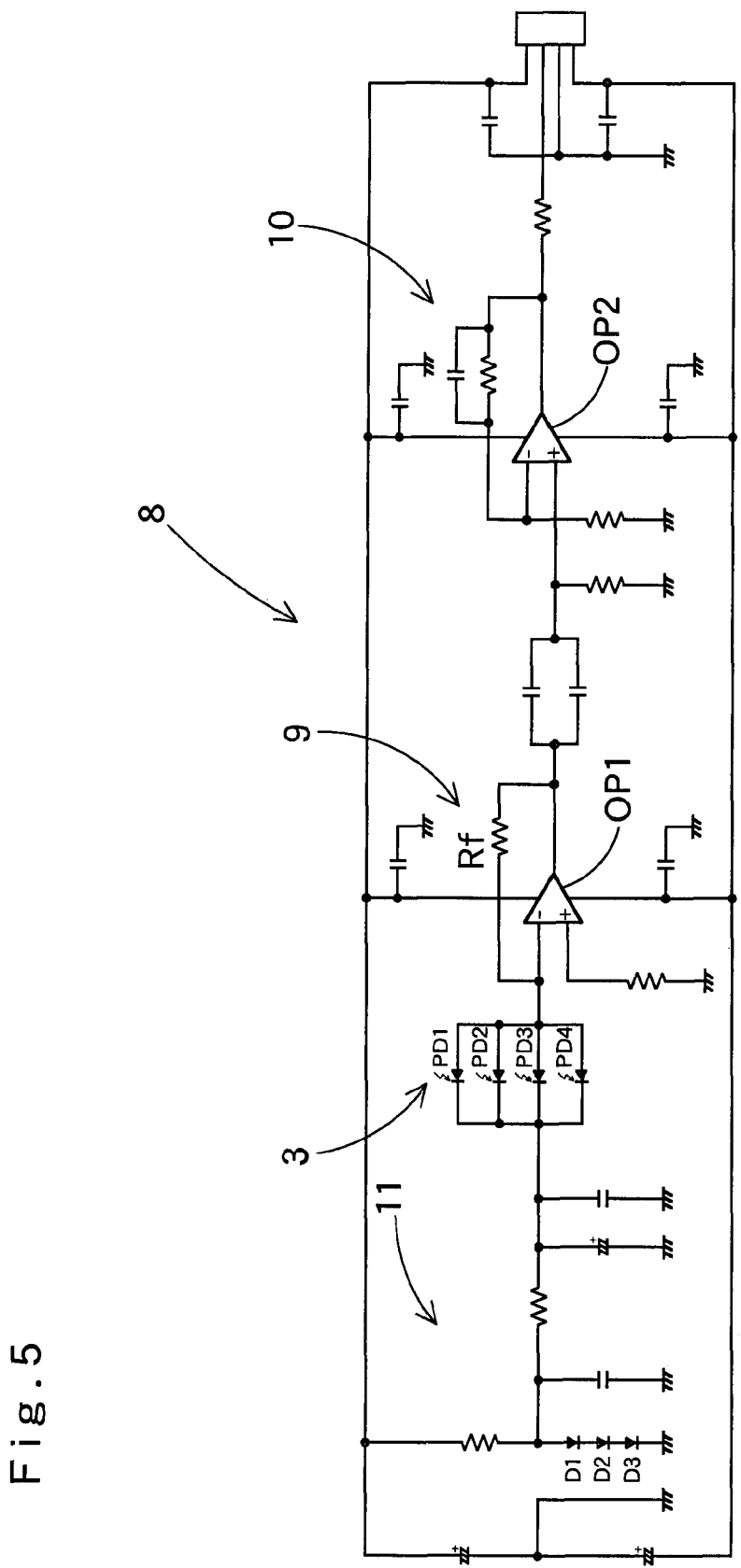
FIG. 5 is a circuit diagram showing a light receiving apparatus for spatial light communications using the reflective collection-type light receiving unit.

FIG. 5 shows one example of a circuit diagram of the light receiving circuit 8 in the light receiving apparatus for spatial light communications using the reflective collection-type light receiving unit 1. As shown in FIG. 5, the respective light receiving elements 3 (PD1 to PD4) of the four reflective collection-type light receiving units 1 are connected to the input side of a preamplifier 9 using an operational amplifier OP1, with their cathodes and anodes connected in parallel to each other.

In general, when a plurality of light receiving elements are connected in parallel and used, an electrostatic capacitance generated between a cathode of each of the light receiving elements and the ground as well as that generated between an anode thereof and the ground are great, and also the electrostatic capacitance is multiplied only by the number of light receiving elements. Therefore, a total electrostatic capacitance of the light receiving elements is increased, and the light receiving element is not made faster in response speed due to the thus increased electrostatic capacitance.

In the present invention, as described above, in each of the reflective collection-type light receiving units 1, electrode leads 4, 5 introduced from the light receiving element 3 thereof are arranged so as to be opened to both sides and connected to a conductive layer 7 of the circuit substrate 6 (on the input side of a preamplifier 9 on the light receiving circuit 8), with a wide clearance given between the electrode leads 4, 5. Therefore, an electrostatic capacitance generated between a cathode of each of the light receiving elements 3 and the ground as well as that between an anode thereof and the ground can be made very small. Thereby, even if the electrostatic capacitance is multiplied only by the number of light receiving elements 3, in particular, the electrostatic capacitance on the anode side of the light receiving element 3 (the output side connected to an operational amplifier OP1) is kept to a minimum level to increase the responsiveness at high speed when receiving light.

As shown in FIG. 5, a reverse bias voltage circuit 11 is connected to the cathode side of each of the light receiving elements 3 (PD1 to PD4). The reverse bias voltage circuit 11 will generate a constant voltage from three diodes (D1, D2, D3) connected serially and apply a predetermined reverse bias voltage to the light receiving elements 3 (PD1 to PD4), thereby operating the light receiving elements 3 at the highest response speed.

Further, in the preamplifier 9 using the operational amplifier OP1 to which the light receiving element 3 is connected, an anode of the light receiving element 3 is connected to an inverting input side of the operational amplifier OP1, and a feedback circuit having a feedback resistance Rf is connected between the output side of the operational amplifier OP1 and the inverting input side, thus constituting a current-voltage conversion circuit by a transimpedance amplifier. More specifically, the preamplifier 9 inputs an output current of the light receiving element 3 into the inverting input side of the operational amplifier OP1, operating the output of the operational amplifier OP1 so as to generate a signal voltage, thereby giving an amplifier circuit having both low noise characteristics and broad band characteristics.

Still further, where four light receiving elements 3 are connected in parallel, the light receiving sensitivity is simply four times greater than the light receiving sensitivity of each of the light receiving elements, thus making it possible to attain a high sensitivity. In addition, in the preamplifier 9 to which each of the light receiving elements 3 is connected, a value of the feedback resistance Rf which is connected to the feedback circuit can be increased according to the number of light receiving elements 3 connected in parallel. Thereby, a gain of the preamplifier 9 is increased according to a value of the feedback resistance Rf, thus making it possible to amplify a signal efficiently.

As shown in FIG. 5, an amplifier 10 to be described later is connected via a coupling condenser to the output side of the preamplifier 9. The amplifier 10 is provided with an operational amplifier OP2, the output side of the preamplifier 9 is connected to the non-inverting input side of the operational amplifier OP2, and the output side of the operational amplifier OP2 of the amplifier 10 is given as an output part of the light receiving circuit 8.

The light receiving apparatus for spatial light communications using the above-constituted reflective collection-type light receiving unit 1 is used in a receiver of a wireless LAN system in which, for example, scattered spatial light (scattered visible light) is given as a medium.

An information signal is subjected to OFDM (orthogonal frequency division multiplex) modulation, for example, then superimposed on spatial light from a transmitter of the wireless LAN system, and illuminated and projected as scattered spatial light from a flood light of the transmitter. The scattered spatial light (scattered visible light) is illuminated and projected from a lamp fitting as white light containing blue light, thereby transmitting a transmission information signal as a transmission medium of the wireless LAN, while illuminating as illumination light.

Spatial light illuminated and projected from a projecting element of the lamp fitting on which the information signal is superimposed is used for illumination as white light, and at a receiver installed in a range covered by the illumination light, the light is received by the reflective collection-type light receiving unit 1. Upon receiving the spatial light illuminated and projected from the lamp fitting of the transmitter, the light receiving element 3 of the reflective collection-type light receiving unit 1 outputs a light receiving signal after amplification by the preamplifier 9, and the signal is further amplified by an amplifier 10. The thus amplified signal is output into an OFDM demodulator (not illustrated) and demodulated.

In this instance, a blue light photodiode higher in responsiveness at as high a level as several hundred megahertz is used as the light receiving element 3 of the reflective collection-type light receiving unit 1, a plurality of the light receiving elements 3 are connected in parallel to attain a high sensitivity, and also an electrostatic capacitance generated on the electrode leads 4, 5 of each of the light receiving elements 3 is kept to a minimum level, thus making it possible to receive and operate the information signal at a high-speed responsiveness. Further, where a transmission information signal modulated by a high frequency wave of 800 KHz, for example, is superimposed on spatial light for transmission, it is necessary to minimize the amount of delay of a group delay up to harmonics of approximately a $40^{th}$ order. However, a blue light photodiode higher in sensitivity and responsiveness at as high as several hundred megahertz can be used to secure a transmission channel over a 32 MHz, which is a wide range of approximately a $40^{th}$ order.

As described above, according to the light receiving apparatus for spatial light communications using the reflective collection-type light receiving unit 1, a plurality of light receiving elements 3 are connected in parallel to the input side of the preamplifier 9 or the like of the light receiving circuit 8, thereby taking an input signal from each of the light receiving elements 3. Therefore, it is possible to increase the light receiving sensitivity (signal receiving sensitivity) according to the number of light receiving elements 3. Since an electrostatic capacitance generated on the light receiving element 3 of each reflective collection-type light receiving unit 1 is made very small as compared with that on a light receiving element of a conventional light receiving unit, it is possible to improve the light receiving element 3 so as to be high in responsiveness and perform spatial light communications at high speed.

Conventionally, light receiving elements such as generally-used photo transistors are lower in sensitivity and response speed, and in particular, in scattered spatial light communications which receive spatial light scattered by indirect illumination in place of direct light to receive a signal, it has been impossible to receive spatial light subjected to OFDM modulation, for example, at a high frequency of as high as several hundred kilohertz to several megahertz and take out an information signal higher in fidelity and excellent in sound and image qualities. However, in the present invention, a plurality of light receiving elements 3 are connected in parallel to increase the light receiving sensitivity and also reduce an electrostatic capacitance generated between an electrode lead of the light receiving element 3 and the ground, thereby improving the light receiving element 3 so as to be high in responsiveness. Therefore, it is possible to receive spatial light modulated at the above-described high frequency and take out an information signal higher in fidelity.

It is noted that in the light receiving apparatus for spatial light communications of the above embodiment, spatial light such as white light or blue light is used as the spatial light. However, infrared light (near infrared light) may be used. In this instance, as the light receiving element of the reflective collection-type light receiving unit, an infrared light photodiode which receives infrared light to output a signal is to be used.

What is claimed is:

1. A reflective collection-type light receiving unit comprising:
    a concave mirror;
        a light receiving element which is arranged approximately at the center inside the concave mirror, with a light receiving plane facing to a reflection plane of the concave mirror; and
        a pair of electrode leads connected to both electrodes of the light receiving element and extended so as to be opened from the center of the concave mirror to both sides of the concave mirror; wherein
        the pair of electrode leads are connected to a light receiving circuit arranged on the back plane of the concave mirror by way of the lateral plane of the concave mirror, and the light receiving element receives spatial light projected, with an information signal superimposed thereon, thereby outputting a generated light receiving signal into the light receiving circuit by way of the electrode leads.

2. The reflective collection-type light receiving unit according to claim 1, wherein the back plane of the concave mirror is fixed firmly on a circuit substrate and the pair of electrode leads extended from the light receiving element are connected and fixed on a conductive layer on the circuit substrate, thereby mounted on the circuit substrate.

3. The reflective collection-type light receiving unit according to claim 1, wherein a main body of the concave mirror is formed in a rectangular solid shape by using a synthetic resin, with a recessed part provided on the front plane, and the pair of electrode leads are fixed from the front plane of the main body along the lateral plane on both sides thereof.

4. The reflective collection-type light receiving unit according to claim 3, wherein a transparent synthetic resin is filled into the recessed part of the concave mirror and a reflecting plane of the concave mirror and a light receiving plane of the light receiving element are covered with the transparent synthetic resin.

5. The reflective collection-type light receiving unit according to claim 3, wherein
    the pair of electrode leads are fitted into a groove formed on the lateral plane on both sides of the main body of the concave mirror and also bonded inside the groove by using an adhesive agent.

6. The reflective collection-type light receiving unit according to claim 1, wherein the concave mirror is set to focus on a position which is deviated forward from the light receiving element position at the center on the front plane of the concave mirror.

7. The reflective collection-type light receiving unit according to claim 1, wherein a blue light photodiode which receives blue light at the highest sensitivity is used as the light receiving element.

8. The reflective collection-type light receiving unit according to claim 1, wherein an infrared light photo diode which receives infrared light at high sensitivity is used as the light receiving element.

9. A light receiving apparatus for spatial light communications using a plurality of reflective collection-type light receiving units comprising:
   a concave mirror;
   a light receiving element which is arranged approximately at the center inside the concave mirror, with a light receiving plane facing to a reflection plane of the concave mirror; and
   a pair of electrode leads connected to both electrodes of the light receiving element and extended so as to be opened from the center of the concave mirror to both sides of the concave mirror; wherein
   the plurality of reflective collection-type light receiving units are arranged in an array and an electrode lead of a light receiving element of each of these reflective collection-type light receiving units is connected to a light receiving circuit by way of the lateral plane of the concave mirror, and the plurality of light receiving elements are connected in parallel to the input side of the light receiving circuit.

10. The light receiving apparatus for spatial light communications according to claim 9, wherein the plurality of reflective collection-type light receiving units are arranged so that the back plane of the concave mirror thereof is firmly fixed on one sheet of a circuit substrate and a pair of electrode leads of each of the light receiving elements in the reflective collection-type light receiving unit are connected to a conductive layer on the circuit substrate.

* * * * *